US006842661B2

(12) United States Patent
Chong et al.

(10) Patent No.: US 6,842,661 B2
(45) Date of Patent: Jan. 11, 2005

(54) PROCESS CONTROL AT AN INTERCONNECT LEVEL

(75) Inventors: Robert J. Chong, Austin, TX (US); Eric O. Green, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 208 days.

(21) Appl. No.: 10/260,894

(22) Filed: Sep. 30, 2002

(65) Prior Publication Data

US 2004/0064214 A1 Apr. 1, 2004

(51) Int. Cl.$^7$ .......................... G06F 19/00; H01L 21/00
(52) U.S. Cl. .......................... 700/121; 438/5
(58) Field of Search ............................ 700/117–121; 438/5–13, 16–18

(56) References Cited

U.S. PATENT DOCUMENTS

| | | | | |
|---|---|---|---|---|
| 5,844,416 | A | * | 12/1998 | Campbell et al. ........... 324/750 |
| 6,054,868 | A | * | 4/2000 | Borden et al. ............. 324/752 |
| 6,157,078 | A | * | 12/2000 | Lansford ................... 257/734 |
| 6,462,538 | B2 | * | 10/2002 | Harada ...................... 324/224 |
| 2001/0004210 | A1 | * | 6/2001 | Harada ...................... 324/224 |
| 2003/0164946 | A1 | * | 9/2003 | Borden et al. ............. 356/432 |
| 2003/0226951 | A1 | * | 12/2003 | Ye et al. ................... 250/208.1 |

FOREIGN PATENT DOCUMENTS

| | | | |
|---|---|---|---|
| WO | 01/50522 A1 | 7/2001 | .......... H01L/21/66 |
| WO | 02/04886 A1 | 1/2002 | .......... G01B/11/06 |

OTHER PUBLICATIONS

Baliga, John; *Advanced Process Control: Soon to be a Must*; Semiconductor International, Jul. 1999, 8 pages.

Fukuda, Etsuo et al.; *Advanced Process Control System Description of an Easy–to–Use Control System Incorporating Pluggable Modules*, 1999 IEEE, pp. 321–324.

Khan, Kareem; *Yield Improvement at the Contact Process Through Run–to–Run Control*, 1999 IEEE, pp. 258, 263.

\* cited by examiner

*Primary Examiner*—Maria N. Von Buhr
(74) *Attorney, Agent, or Firm*—Williams, Morgan & Amerson, P.C.

(57) ABSTRACT

A method and an apparatus for performing process control at an interconnect level. A process step upon a workpiece is performed. Manufacturing data relating to an interconnect location on the workpiece is acquired. An interconnect characteristic control process is performed based upon the manufacturing data. The interconnect characteristic control process includes controlling a process relating to a structure associated with the interconnect location on the workpiece to control a characteristic relating to the interconnect location.

36 Claims, 9 Drawing Sheets

PROCESS CONTROL AT AN INTERCONNECT LEVEL

BACKGROUND OF THE INVENTION

1. Field of the Invention

This invention relates generally to semiconductor manufacturing, and, more particularly, to a method and apparatus for performing process control at an interconnect level on a workpiece.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer that may be composed of a variety of different materials may be formed across a semiconductor wafer. Thereafter, a patterned layer of photoresist may be formed across the process layer using known photolithography techniques. Typically, an etch process is then performed across the process layer using the patterned layer of photoresist as a mask. This etching process results in the formation of various features or objects in the process layer. Such features may be used as, for example, a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on approximately one to four die 103 locations at a time, depending on the specific photomask employed. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, a flowchart depiction of a prior art process flow is illustrated. A manufacturing system may process a plurality of semiconductor wafers 105 associated with a batch/lot (block 210). After performing various processes on the semiconductor wafers 105, the manufacturing system may perform a final electrical test on the processed semiconductor wafers 105 (block 220). The final electrical test may comprise measuring a plurality of electrical parameters, such as resistance measurements related to one or more locations on the semiconductor wafers 105. Data from the electrical test may be used by the manufacturing system to determine interconnect characteristics of various contacts and/or vias formed on the semiconductor wafers 105 (block 230).

Upon determining various interconnect characteristics, such as interconnect resistance, and the like, the manufacturing system may calculate adjustments to modify interconnect characteristics for subsequently processed semiconductor wafers 105 by performing adjustments to other processes (block 240). Based upon the calculated adjustments, the system may make adjustments to processing steps performed on subsequent semiconductor wafers 105 (block 250).

Among the problems associated with the current methodology includes the fact that, generally, characterization of interconnect parameters are made after numerous processes are performed on the semiconductor wafers 105. Generally, the interconnect characteristics are only accurately realized after substantial processing of semiconductor wafers 105. Therefore, since the processing of the interconnects is substantially complete with no, or few, process steps remaining, there is an inherent lack of feedback correction abilities based upon the current methodology. Utilizing current processing techniques, controlling interconnect characteristics is difficult and may be inefficient due to the fact that the interconnect characteristics are determined after substantial processing of semiconductor wafers 105. Additionally, there may be a delay between the time period when the interconnect are formed to the time period when a final wafer electrical test is performed, thereby reducing the probability of correcting interconnect errors.

The present invention is directed to overcoming, or at least reducing, the effects of, one or more of the problems set forth above.

SUMMARY OF THE INVENTION

In one aspect of the present invention, a method is provided for performing process control at an interconnect level. A process step upon a workpiece is performed. Manufacturing data relating to an interconnect location on the workpiece is acquired. An interconnect characteristic control process is performed based upon the manufacturing data. The interconnect characteristic control process includes controlling a process relating to a structure associated with the interconnect location on the workpiece to control a characteristic relating to the interconnect location.

In another aspect of the present invention, a system is provided for performing process control at an interconnect level. The system includes a processing tool to process a workpiece. The system also includes a process controller operatively coupled to the processing tool. The process controller is capable of performing an interconnect characteristic control process based upon manufacturing data relating to the workpiece. The interconnect characteristic control process includes controlling a process relating to a structure associated with an interconnect location on the workpiece to control a characteristic relating to the interconnect location.

In another aspect of the present invention, an apparatus is provided for performing process control at an interconnect level. The apparatus includes a process controller adapted to perform an interconnect characteristic control process based upon manufacturing data relating to a workpiece. The interconnect characteristic control process includes controlling a process relating to a structure associated with an interconnect location on the workpiece to control a characteristic relating to the interconnect location.

In yet another aspect of the present invention, a computer readable program storage device encoded with instructions is provided for performing process control at an interconnect level. The computer readable program storage device encoded with instructions that, when executed by a computer, performs a method, which comprises: performing a process step upon a workpiece; acquiring manufacturing data relating to an interconnect location on the workpiece; and performing an interconnect characteristic control process based upon the manufacturing data. The interconnect characteristic control process includes controlling a process relating to a structure associated with the interconnect location on the workpiece to control a characteristic relating to the interconnect location.

BRIEF DESCRIPTION OF THE DRAWINGS

The invention may be understood by reference to the following description taken in conjunction with the accompanying drawings, in which like reference numerals identify like elements, and in which.

Figure 1:
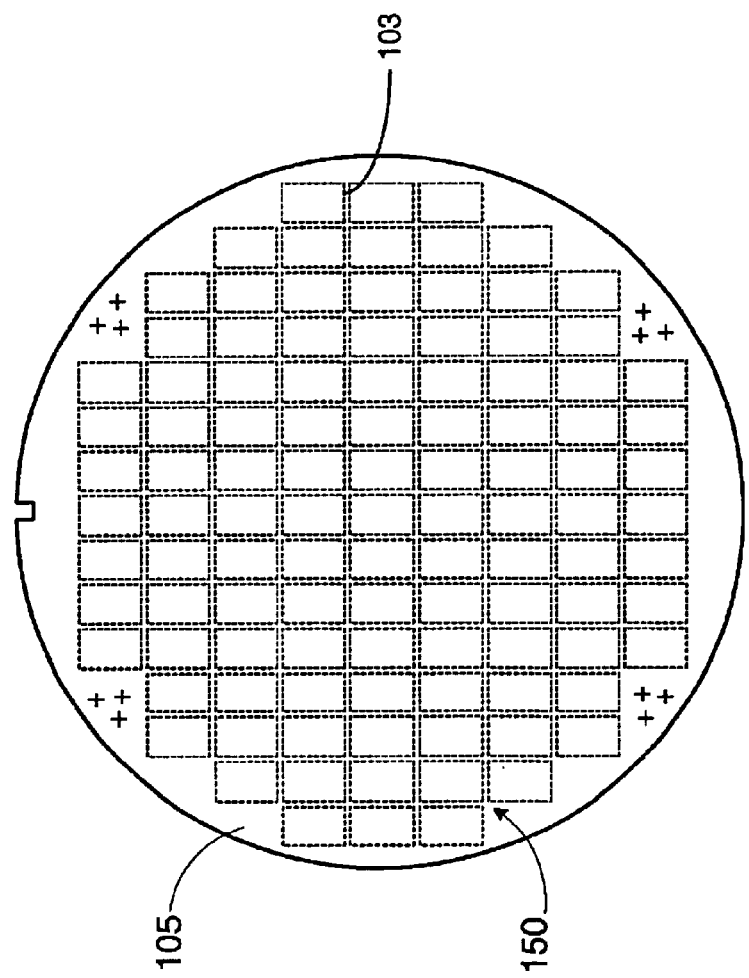
FIG. 1 is a simplified diagram of a prior art semiconductor wafer being processed.
Figure 2:
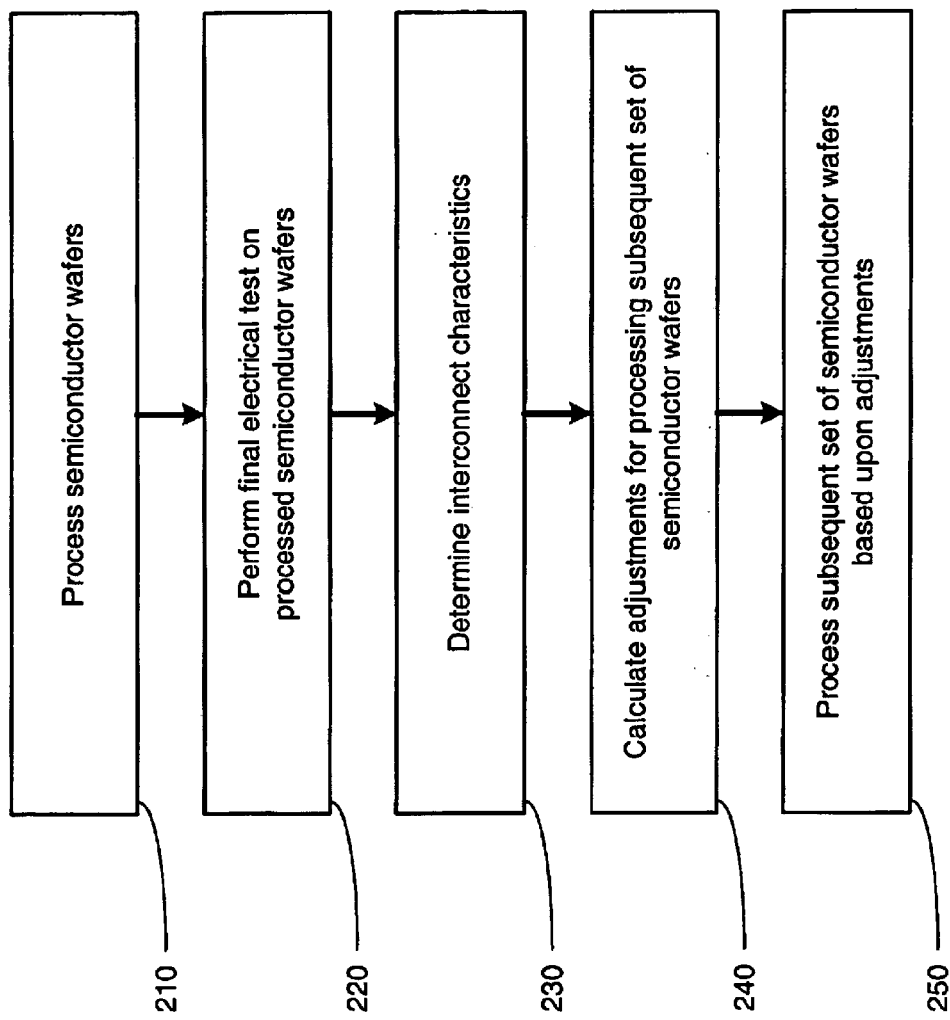
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, workpieces (e.g., semiconductor wafers 105, semiconductor devices, etc.) are stepped through multiple manufacturing process tools. Embodiments of the present invention provide for performing process control to affect interconnect characteristics of a plurality of locations, such as contacts and/or vias, on semiconductor wafers 105. Embodiments of the present invention provide for adjusting several parameters that control various process steps on semiconductor wafers 105, such as controlling the development of barrier liners, controlling the ILD layer thickness, controlling the geometry of interconnect locations, controlling pre-metal dielectric layers, controlling barrier layers, and the like. Embodiments of the present invention provide for performing wafer electrical tests to determine resistivity of interconnect locations on semiconductor wafers 105 and performing control adjustments to modify electrical characteristics of the interconnect locations.

Figure 3:
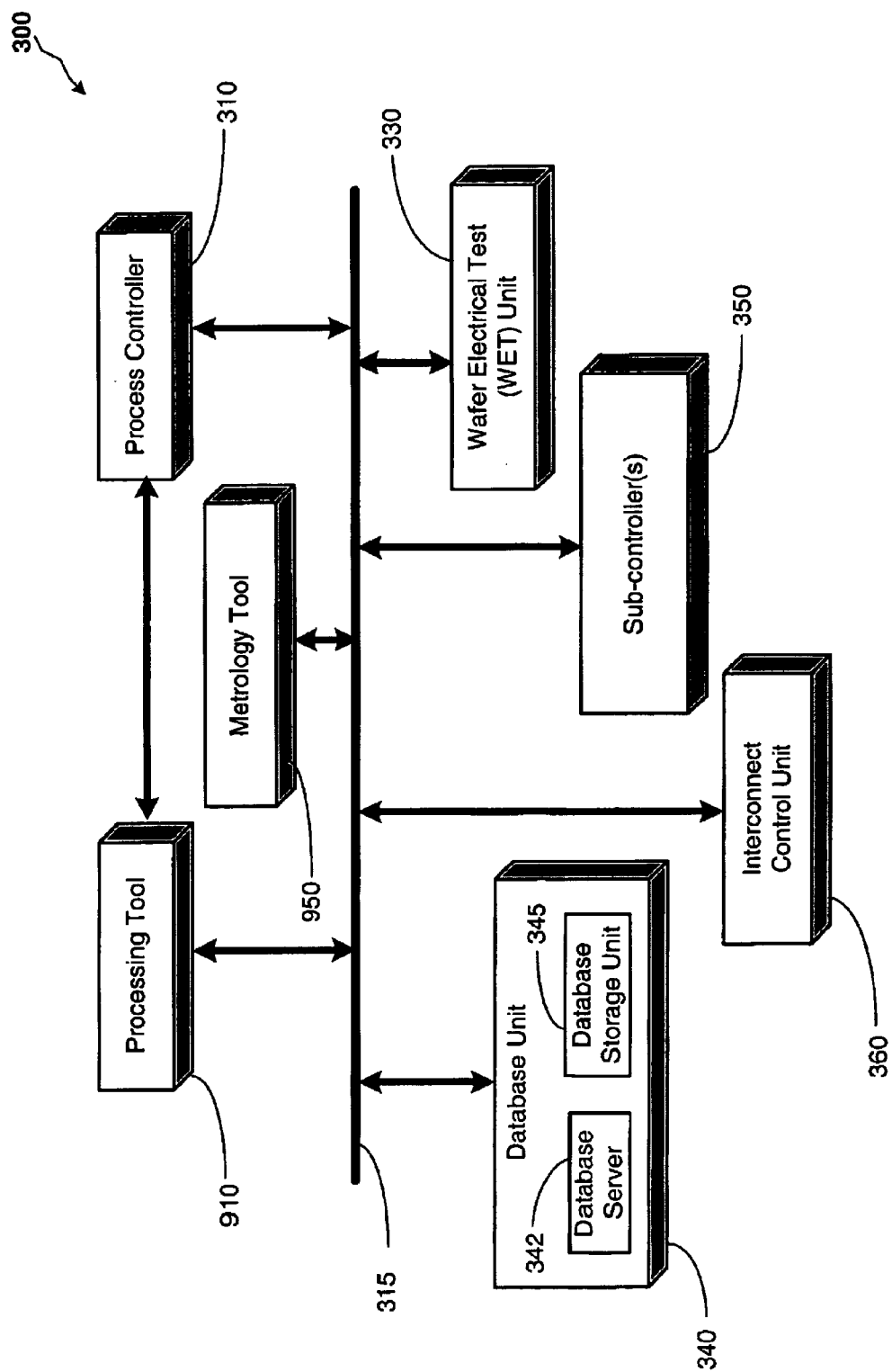
FIG. 3 provides a block diagram representation of a system in accordance with one illustrative embodiment of the present invention.

Turning now to FIG. 3, a block diagram depiction of a system 300 in accordance with embodiments of the present invention is illustrated. A process controller 310 in the system 300 is capable of controlling various operations relating to a processing tool 910. The system 300 is capable of acquiring manufacturing related data, such as metrology data related to processed semiconductor wafers 105, tool state data, and the like. The system 300 may also comprise a metrology tool 950 to acquire metrology data related to the processed semiconductor wafers 105.

The system 300 may also comprise a database unit 340. The database unit 340 is provided for storing a plurality of types of data, such as manufacturing-related data, data related to the operation of the system 300 (e.g., the status of the processing tool 910, the status of semiconductor wafers 105, etc.). The database unit 340 may store tool state data relating to a plurality of process runs performed by the processing tool 910. The database unit 340 may comprise a database server 342 for storing tool state data and/or other manufacturing data related to processing semiconductor wafers 105 into a database storage unit 345.

The system 300 also comprises a wafer electrical test (WET) unit 330 that is capable of performing a plurality of electrical tests that provide data relating to the electrical characteristics of various interconnect locations (e.g., contacts and/or vias) on the semiconductor wafers 105. The system 300 may comprise a plurality of sub-controllers 350 that are capable of controlling various process steps that are performed on the semiconductor wafers 105. For example, the process controller 310 may provide predetermined electrical characteristic values, such as a predetermined resistivity value for particular interconnect locations, which may be used by the sub-controllers 350 to calculate control adjustments for various control process steps performed on the semiconductor wafers 105. A more detailed illustration and description of the sub-controllers 350 is provided in FIG. 4 and accompanying description below.

Additionally, the system 300 may comprise an interconnect control unit 360 that is capable of controlling the characteristics of interconnect locations, such as vias and contacts, on the semiconductor wafers 105. A more detailed illustration and description of the interconnect control unit 360 is provided in FIG. 8 and accompanying description below. The system 300 is capable of performing various control adjustments to affect the characteristics of various interconnect locations on the semiconductor wafers 105, e.g., controlling the resistivity of a via and/or a contact.

The process controller 310, the sub-controllers 350, and/or the interconnect control unit 360, may be software, hardware, or firmware unit(s) that are standalone units or may be integrated into a computer system associated with the system 300. Furthermore, the various components represented by the blocks illustrated in FIG. 3 may communicate with one another via a system communications line 315. The system communications line 315 may be a computer bus link, a dedicated hardware communications link, a telephone system communications link, a wireless communications link, or other communication links that may be implemented by those skilled in the art having benefit of the present disclosure.

Figure 4:
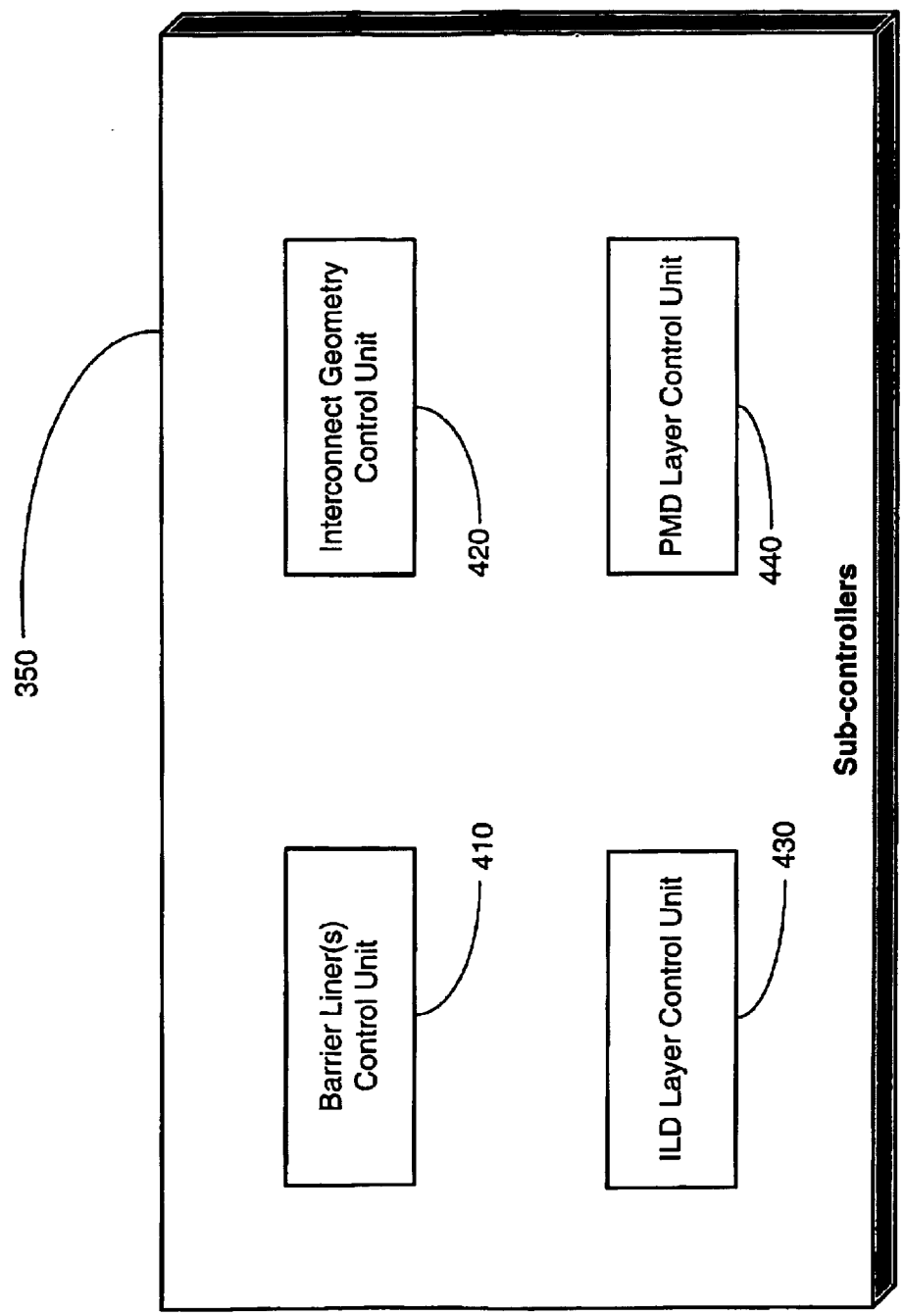
FIG. 4 illustrates a more detailed block diagram representation of one or more sub-controller(s) of FIG. 3, in accordance with one illustrative embodiment of the present invention.

Turning now to FIG. 4, a more detailed block diagram illustration of the sub-controllers 350 in accordance with embodiments of the present invention is illustrated. The sub-controller 350 may comprise various control units, such as a barrier liner control unit 410, an interconnect geometry control unit 420, an inner-layer dielectric between metal lines (ILD) layer control unit 430, a pre-metal dielectric (PMD) layer control unit 440, and/or various other control units to control the process steps performed on the semiconductor wafers 105. Data from the WET unit 330 and interconnect characteristics that are predetermined by the process controller 310, may be used by the sub-controllers 350 to control various portions of the semiconductor wafers 105, such as the barrier liners, the ILD layer, the geometry layer and the PMD layer.

Figure 6:
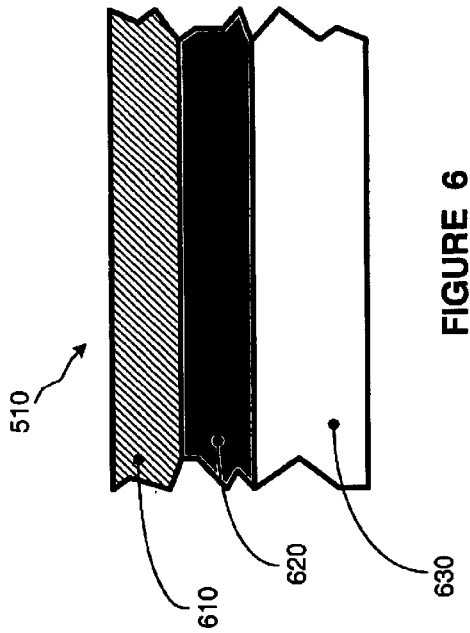
FIG. 6 illustrates a cross-sectional diagram of a barrier layer of the semiconductor wafer of FIG. 5, in accordance with one illustrative embodiment of the present invention.
Figure 5:
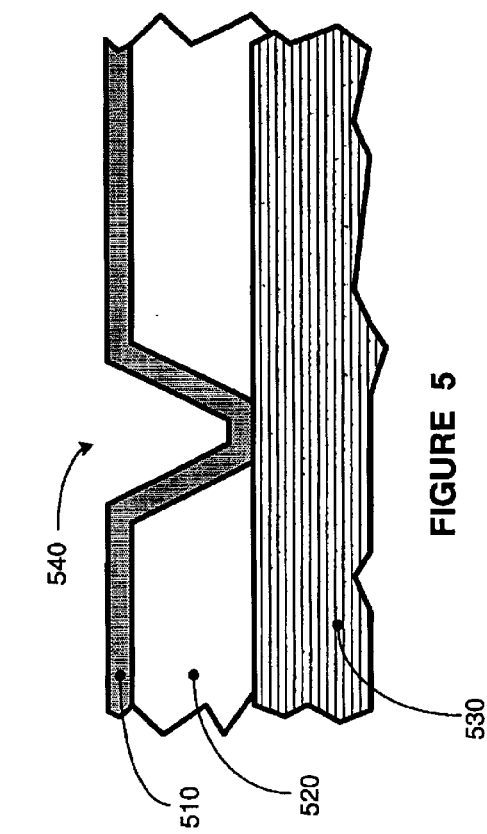
FIG. 5 illustrates a cross-sectional diagram of a semiconductor wafer with a contact, in accordance with one illustrative embodiment of the present invention.
Figure 7:
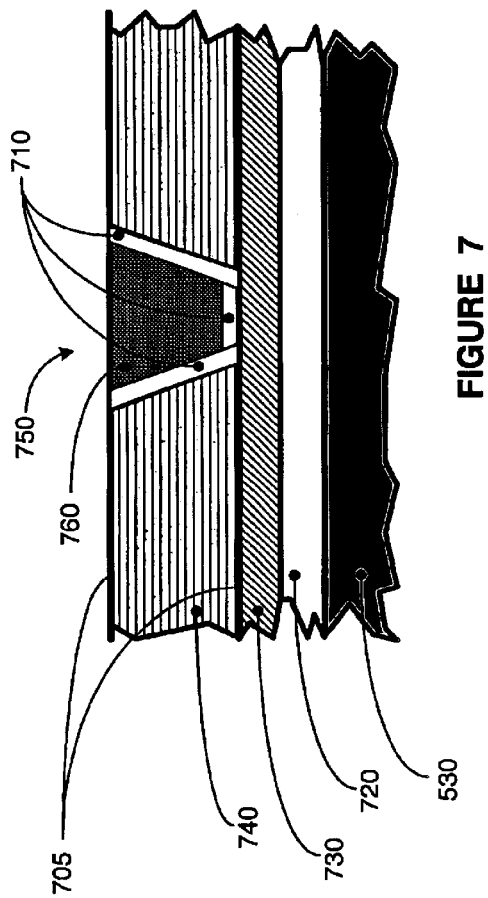
FIG. 7 illustrates a cross-sectional diagram of a semiconductor wafer with a via, in accordance with one illustrative embodiment of the present invention.

Turning now to FIGS. 5–7, cross-sectional illustrations of a semiconductor wafer 105 with a trench and/or via is illustrated. FIG. 5 shows a ILD layer 520 that is deposited upon a substrate layer 530. Within the ILD layer 520, a trench 540 may be formed. The trench 540 may be used to form various structures. In one embodiment, the trench 540 may be used to form a contact. In one embodiment, the trench 540 may be used to perform a damascene process, which may be used to create metal lines, contacts, and/or vias; however, other processes known to those skilled in the art having benefit of the present disclosure may be employed to create metal lines, contacts, and/or vias. The trench 540 may be lined with a barrier layer 510 to isolate the trench 540 from the ILD layer 520. Generally, the trench 540 may be filled with a metal such as tungsten or copper to form an interconnect location. Certain characteristics of the interconnect formed in the trench 540, e.g., resistivity, may influence the barrier liner control unit 410, which may adjust control parameters that affect the formation of the barrier layer 510. The barrier layer 510 is shown in more detail in FIG. 6. The barrier layer 510 may comprise a tantalum layer 610, a tantalum nitride layer 620, and an PMD layer 630. The tantalum nitride layer 620 may be positioned between the tantalum layer 610 and the PMD layer 630. Adjustments made to the PMD layer 630 may affect the barrier layer 510, which in turn may affect the characteristics of a contact formed from the trench 540. The ILD layer control unit 430 is capable of controlling the processing of the PMD layer 630, which may affect the barrier layer 510, thereby influencing the characteristic(s) of the trench 540. Adjusting the composition of the barrier layer 510 (e.g., a tantalum/tantalum-nitride/tantalum combination) may affect the characteristic (e.g., resitivity) of an interconnect. Additionally, adjusting the respective ratios of the film thickness of the layers that form the barrier layer 510 (see FIG. 6) may affect the characteristic (e.g., resitivity) of an interconnect. Other metal deposition processes may be employed by embodiments of the present invention to affect the characteristic (e.g., resitivity) of an interconnect.

Turning back to FIG. 6, other formations surrounding the trench 540 may be controlled to affect the characteristics of a via formed from the trench 540. For example the ILD layer 520 may be controlled to affect the characteristic(s) of the via formed from the trench 540. The ILD layer control unit 430 may affect the characteristics of the trench 540 by controlling the characteristics of the ILD layer 520. Additionally, the interconnect geometry control unit 420 may control the geometry of the trench 540, which may affect the amount of metal deposited into the trench 540 to make the interconnect. Therefore, the sub-controllers 350 may be used to affect electrical characteristics of the interconnect location, such as the trench 540 that is filled with a metal to form a via.

FIG. 7 illustrates a cross-sectional view of a semiconductor wafer 105 with a via 750 being formed therein. In one embodiment, a dielectric layer 720 is deposited upon the substrate layer 530, upon which a metal layer 730 is formed. The metal layer 730 may comprise aluminum and/or copper. In one embodiment, a damascene process may be used to form the metal lines 705. The via 750 is generally formed to electrically couple two metal surfaces, such as the two metal lines 705 illustrated in FIG. 7. The two metal lines 705 may be separated by a dielectric layer 740. Therefore, the via 750 may be utilized to interconnect the two metal lines 705 that are separated by the dielectric layer 740. The via 750 may be formed from a trench 540 (see FIG. 5) that is filled with a metal filling substance 760, such as copper. The via 750 may be separated from the dielectric layer 740 by a barrier liner 710.

The resistivity of the via 750 and/or other contacts may affect the operation of a device manufactured from the processed semiconductor wafers 105. Therefore, controlling the resistivity to be within a predetermined range of tolerance may lead to more accurately processed devices produced from semiconductor wafers 105. The barrier liner control unit 410 is capable of controlling the characteristics of the barrier liner 710, which may influence the characteristics of the via 750 that is deposited upon the metal layer 730. Therefore, utilizing the sub-controllers 350, feedback and/or feed-forward control that affects electrical characteristics of the interconnect locations, such as contacts and vias, may be achieved. Utilizing embodiments of the present invention, control of process(es) relating to one or more structures associated with an interconnect (e.g., the ILD layer 520, PMD layer 630, barrier layer 510, barrier liner 710, the trench 540, via 750, the metal lines 705, etc.) may be performed to adjust a characteristic (e.g., the resistivity) of the interconnect.

Figure 8:
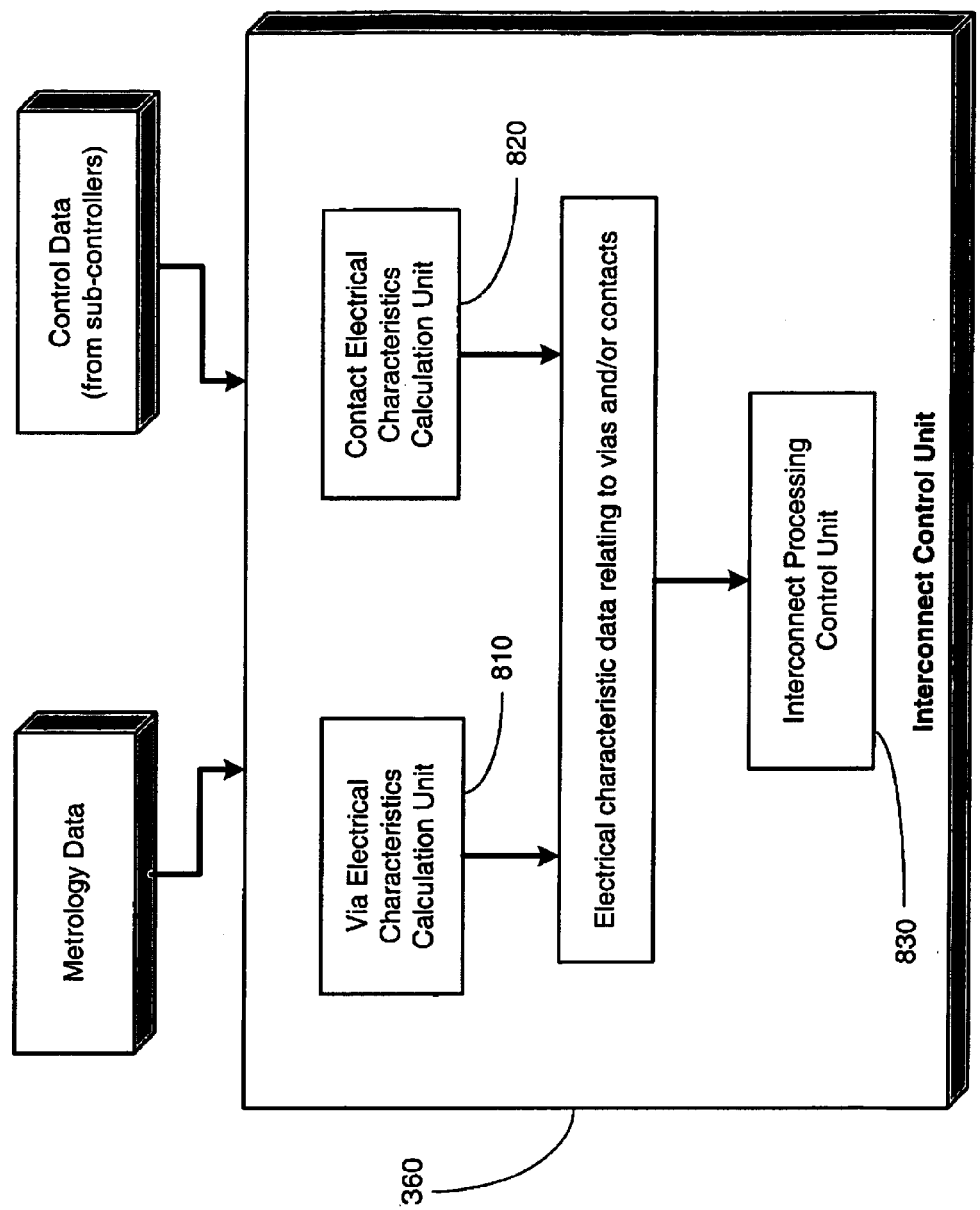
FIG. 8 illustrates a more detailed block diagram representation of an interconnect control unit of FIG. 3, in accordance with one illustrative embodiment of the present invention.

Turning now to FIG. 8, a more detailed block diagram depiction of the interconnect control unit 360 is illustrated. The interconnect control unit 360 may receive metrology data relating to the processed semiconductor wafers 105. The metrology data may include measurements relating to the barrier layers 510, ILD layers 630, PMD layers 520, and/or trench formations used to form interconnect locations, etc. The interconnect control unit 360 may also receive control data from the sub-controllers 350, which may relate to control data that is influenced from the interconnect characteristics prescribed by the process controller 310. Utilizing the metrology data and/or the control data, the interconnect control unit 360 may cause adjustments to be made upon a plurality of process steps performed on the semiconductor wafer 105 in order to affect the characteristics of the interconnect locations formed on the semiconductor wafers 105 (e.g., the resitivity of a contact or a via formed on the semiconductor wafer 105).

The interconnect control unit 360 may comprise a via electrical characteristics calculation unit 810 that is capable of making a prediction or determining the possible electrical characteristics, such as resistivity, of a via that is to be formed on a semiconductor wafers 105. The interconnect control unit 360 may also comprise a contact electrical characteristics calculation unit 820 to predict or determine the possible electrical characteristics of the contact formed on the semiconductor wafer 105. The electrical characteristic data relating to the vias and/or other contacts may then be examined by the interconnect processing control unit 830. The interconnect processing control unit 830 is capable of adjusting various process steps, such as metal disposition processes, interconnect region barrier layer 510 processing, PMD layer 630 processing, and/or PMD layer 520 processing, which are processing steps that may be affected by adjustment data to control the operation of the sub-controllers 350. In other words, the interconnect processing control unit 830 is capable of calculating possible electrical characteristics of the interconnect locations and providing appropriate corrective data to various portions of the system 300 to implement control corrections of interconnect locations.

Figure 9:
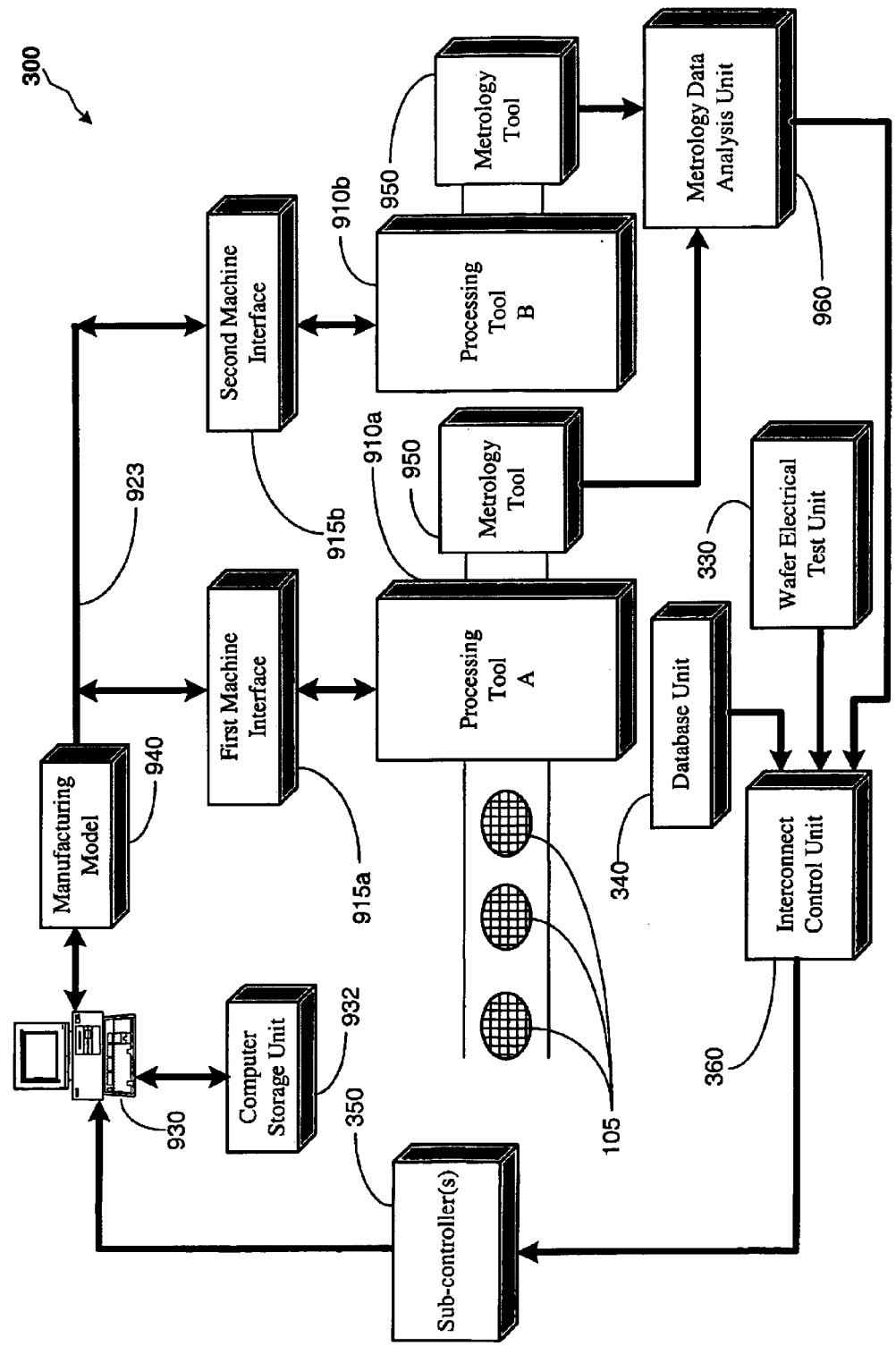
FIG. 9 illustrates a more detailed block diagram representation of the system shown in FIG. 3, in accordance with one illustrative embodiment of the present invention.

Turning now to FIG. 9, a more detailed block diagram of the system 300 in accordance with one embodiment of the present invention is illustrated. Semiconductor wafers 105 are processed on processing tools 910a, 910b using a plurality of control input signals, or manufacturing parameters, provided via a line or network 923. The control input signals, or manufacturing parameters, on the line 923 are sent to the processing tools 910a, 910b from a computer system 930 via machine interfaces 915a, 915b. The first and second machine interfaces 915a, 915b are generally located outside the processing tools 910a, 910b. In an alternative embodiment, the first and second machine interfaces 915a, 915b are located within the processing tools 910a, 910b. The semiconductor wafers 105 are provided to and carried from a plurality of processing tools 910. In one embodiment, semiconductor wafers 105 may be provided to a processing tool 910 manually. In an alternative embodiment, semiconductor wafers 105 may be provided to a processing tool 910 in an automatic fashion (e.g., robotic movement of semiconductor wafers 105). In one embodiment, a plurality of semiconductor wafers 105 is transported in lots (e.g., stacked in cassettes) to the processing tools 910.

In one embodiment, the computer system 930 sends control input signals, or manufacturing parameters, on the line 923 to the first and second machine interfaces 915a, 915b. The computer system 930 is capable of controlling processing operations. In one embodiment, the computer system 930 is a process controller. The computer system 930 is coupled to a computer storage unit 932 that may contain a plurality of software programs and data sets. The computer system 930 may contain one or more processors (not shown) that are capable of performing the operations described herein. The computer system 930 employs a manufacturing model 940 to generate control input signals on the line 923. In one embodiment, the manufacturing model 940 contains a manufacturing recipe that determines a plurality of control input parameters that are sent on the line 923 to the processing tools 910a, 910b.

In one embodiment, the manufacturing model 940 defines a process script and input control that implement a particular manufacturing process. The control input signals (or control input parameters) on the line 923 that are intended for processing tool A 910a are received and processed by the first machine interface 915a. The control input signals on the line 923 that are intended for processing tool B 910b are received and processed by the second machine interface 915b. Examples of the processing tools 910a, 910b used in semiconductor manufacturing processes are steppers, etch process tools, deposition tools, and the like.

One or more of the semiconductor wafers 105 that are processed by the processing tools 910a, 910b can also be sent to a metrology tool 950 for acquisition of metrology data. The metrology tool 950 may be a scatterometry data acquisition tool, an overlay-error measurement tool, a critical dimension measurement tool, and the like. In one embodiment, a metrology tool 950 examines one or more processed semiconductor wafers 105. The metrology data analysis unit 960 may collect, organize, and analyze data from the metrology tool 950. The metrology data is directed to a variety of physical or electrical characteristics of the devices formed across the semiconductor wafers 105. For example, metrology data may be obtained as to line width measurements, depth of trenches, sidewall angles, thickness, resistance, and the like. Metrology data may be used to determine faults that may be present across the processed semiconductor wafers 105, which may be used to quantify the performance of the processing tools 910.

As provided above, analyzed metrology data from the metrology data analysis unit 960, electrical characteristics data from the wafer electrical test unit 330, and/or data from the database unit 340 may be received by the interconnect control unit 360. The interconnect control unit 360 may determine the possible and/or actual electrical characteristics of vias and/or contacts. In response to such a determination, the interconnect control unit 360 may provide data relating to process adjustments to the sub-controllers 350. The sub-controllers 350 may calculate feedback and/or feed-forward corrections to be implemented upon various processes performed on the semiconductor wafers 105. Data relating to feedback and/or feed-forward correction may then be sent by the sub-controllers 350 to the computer system 930. The computer system 930 may then implement responsive control adjustment(s) to subsequent processes performed by the system 300.

Figure 10:
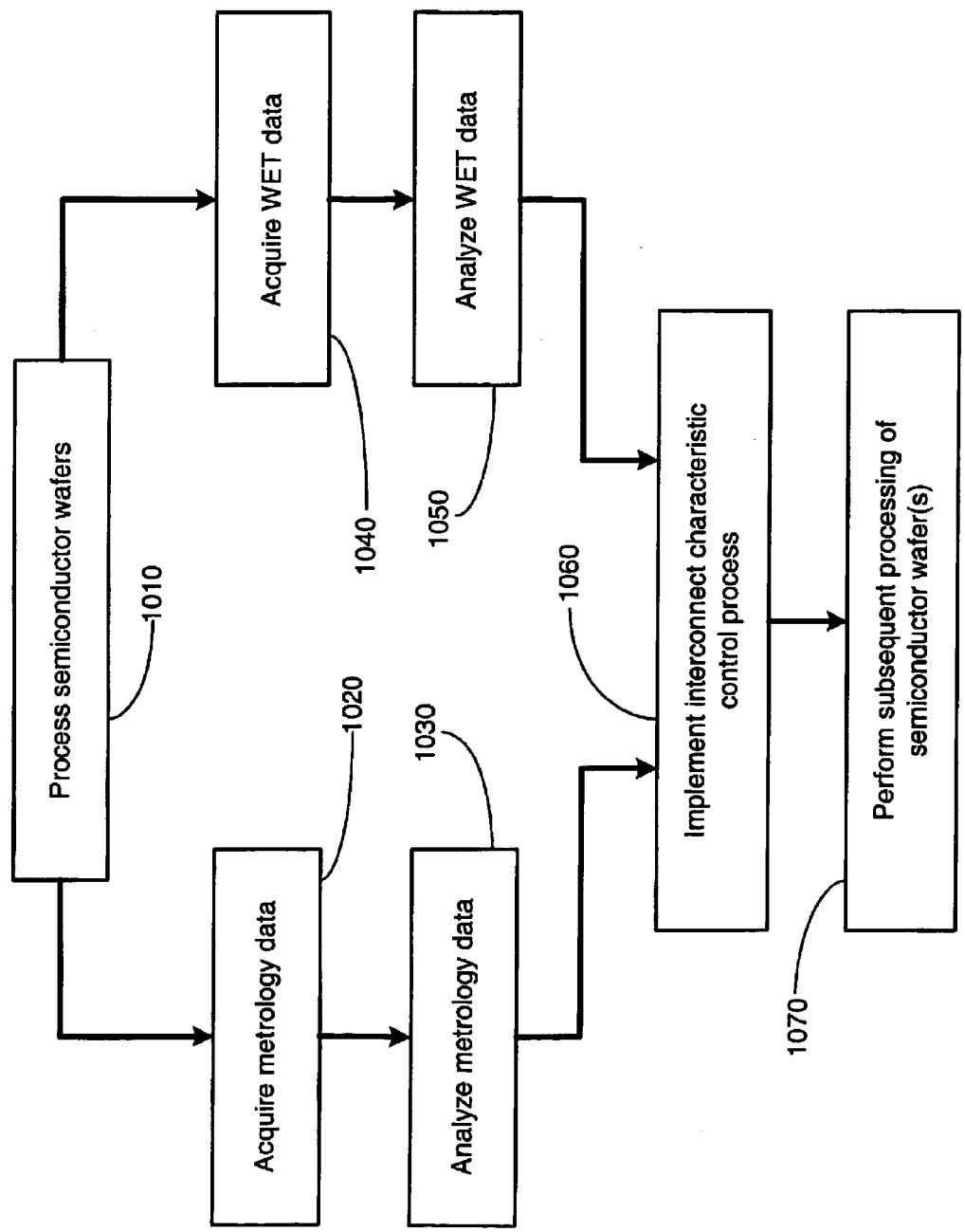
FIG. 10 illustrates a flowchart depiction of a method in accordance with one illustrative embodiment of the present invention.

Turning now to FIG. 10, a flow chart depiction of embodiments of the present invention is illustrated. The system 300 performs processes on semiconductor wafers 105 (block 1010). Upon processing the semiconductor wafers 105, generally, manufacturing data, such as metrology data and/or wafer test data, is acquired. The system 300 may acquire metrology data relating to the processed semiconductor wafers 105 (block 1020). Metrology data may then be analyzed to determine a plurality of characteristics, such as barrier layer characteristics, PMD layer electronic characteristics, ILD layer characteristics, trench characteristics, and the like (block 1030). The system 300 may also acquire wafer electrical test data relating to electrical characteristics of various interconnect locations on the semiconductor wafers 105 (block 1040). The system 300 may analyze the wafer electrical test data to determine the various characteristics such as the resistance at particular contacts and/or vias formed on the semiconductor wafers 105 (block 1050).

Upon analysis of the metrology data and/or the WET data, the system 300 may implement an interconnect characteristic control process to affect the characteristics of interconnect locations (e.g., vias, contact, etc.) on the semiconductor wafers 105 (block 1060). Feedback and/or feed forward corrections may be utilized to control interconnect characteristics formed on the semiconductor wafers 105. A more detailed description of the step of implementing the interconnection characteristics control process is provided in FIG. 11 and accompanying description below. Data from the interconnect characteristic control process may be used to perform subsequent processes on semiconductor wafers 105 so that characteristics of the contacts and/or vias may be brought within acceptable predetermined tolerances (block 1070).

Figure 11:
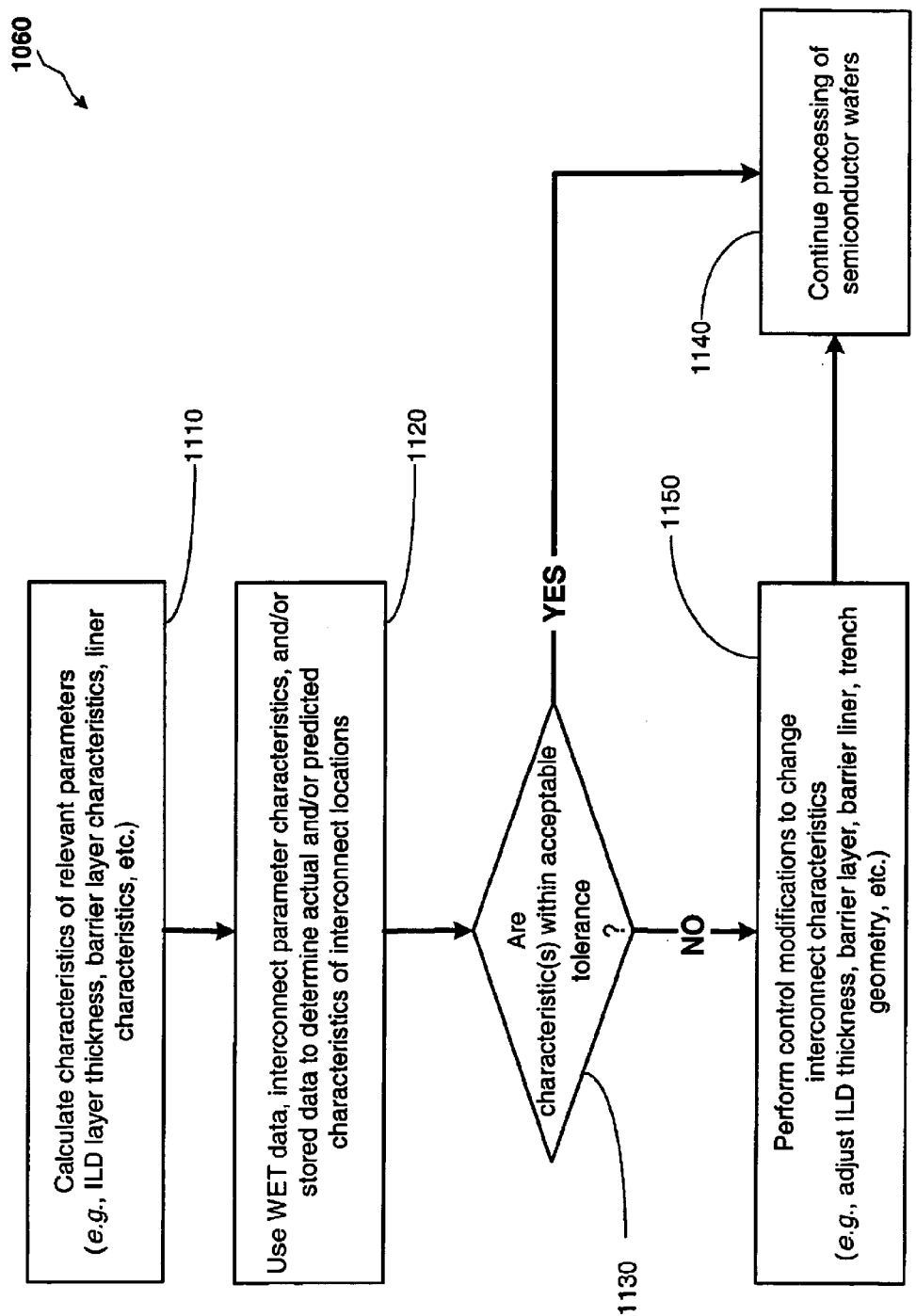
FIG. 11 illustrates a more detailed flowchart depiction of a method of an interconnect characteristic control process, as indicated in FIG. 10, in accordance with one illustrative embodiment of the present invention.

Turning now to FIG. 11, a more detailed flowchart depiction of the step of implementing the interconnect characteristics control process, as indicated in block 1060 of FIG. 10, is illustrated. The system 300 calculates relevant parameters relating to the via and/or contacts (block 1110). For example, the system 300 may calculate the ILD layer thickness, the barrier layer characteristics, the barrier liner characteristics, and/or the trench geometry characteristics relating to contacts or vias formed on the semiconductor wafers 105. The system 300 may use the WET data, the interconnect parameter characteristics, and/or stored data relating to interconnect formations to determine characteristics of interconnect locations formed on the semiconductor wafers 105 (block 1120). The interconnect characteristics may relate to actual or predicted characteristics of the interconnect locations formed on the semiconductor wafers 105. The system 300 then determines whether the actual or predicted electrical characteristics of interconnect locations on the semiconductor wafers 105 are within a predetermined acceptable range of tolerance (block 1130). In response to the determination that the characteristics of the applications are within a predetermined range of tolerance, the system 300 continues processing of the semiconductor wafers 105 (block 1140) without significant modification or alteration to the process.

Upon a determination that the actual and/or predicted characteristics of the interconnect locations are outside an acceptable range, a control modification is implemented to change the interconnect characteristics (block 1150). This control adjustment may include adjusting the ILD layer thickness, the PMD layer characteristics, the barrier layer thickness, the barrier liner characteristics, trench characteristics, and the like. The sub-controllers 350 receive data from the interconnect control unit 360, which may be used to influence process steps performed on the semiconductor wafers 105 to affect the characteristics of the interconnect locations. The completion of the steps described in FIG. 11 substantially produce the process of performing the implementation of the interconnect characteristic control process described in block 1060 of FIG. 10.

Utilizing embodiments of the present invention, control adjustments to affect characteristics of interconnect locations may be performed to increase the accuracy of the operation of devices formed in the processing of semiconductor wafers 105. Process control techniques may be used to affect subtle characteristics of interconnect locations formed on the semiconductor wafers 105, thereby improving the performance of devices manufactured from the semiconductor wafers 105.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC framework is a preferred platform from which to implement the control strategy taught by the present invention. In some embodiments, the APC framework can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC framework allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   performing a process step upon a workpiece;
   acquiring manufacturing data relating to an interconnect location on said workpiece; and
   performing an interconnect characteristic control process based upon said manufacturing data, said interconnect characteristic control process comprising controlling at least one of a barrier layer process, a pre-dielectric process, an ILD process, and a metal deposition process relating to a structure associated with said interconnect location on said workpiece to control a characteristic relating to said interconnect location.

2. The method of claim 1, wherein performing said process step upon said workpiece further comprises performing said process step upon a semiconductor wafer.

3. The method of claim 2, wherein performing a process step upon a workpiece comprises forming an interconnect location upon said semiconductor wafer.

4. The method of claim 3, wherein forming an interconnect location upon said semiconductor wafer comprises forming a via upon said semiconductor wafer.

5. The method of claim 3, wherein forming an interconnect location upon said semiconductor wafer comprises forming a contact region upon said semiconductor wafer.

6. The method of claim 2, wherein acquiring manufacturing data relating to said interconnect location on said workpiece further comprises acquiring metrology relating to said processed semiconductor wafer.

7. The method of claim 1, wherein acquiring manufacturing data relating to said interconnect location on said workpiece further comprises acquiring wafer electrical test data relating to said processed semiconductor wafer.

8. The method of claim 1, wherein performing an interconnect characteristic control process further comprises controlling at least one of a barrier layer process, an inner-layer dielectric (ILD) layer process, pre-metal dielectric (PMD) process, and a metal deposition process.

9. The method of claim 1, wherein performing an interconnect characteristic control process further comprises modifying a resistivity of said interconnect location.

10. A method, comprising:
    performing a process step upon a workpiece;
    acquiring metrology data relating to an interconnect location on said workpiece; and
    performing an interconnect characteristic control process based upon said metrology data, said interconnect characteristic control process comprising controlling at least one of a barrier layer process, a pre-dielectric process, an ILD process, end a metal deposition process to affect a resistance relating to said interconnect location.

11. The method of claim 10, wherein performing said process step upon said workpiece further comprises performing said process step upon a semiconductor wafer.

12. An apparatus, comprising:
    means for performing a process stop upon a workpiece;
    means for acquiring manufacturing data relating to an interconnect location on said workpiece; and
    means for performing an interconnect characteristic control process based upon said manufacturing data, said interconnect characteristic control process comprising controlling at least one of a barrier layer process, a pre-dielectric process, an ILD process, and a metal deposition process relating to a structure associated with said interconnect location on said workpiece to control a characteristic relating to said interconnect location.

13. A system, comprising:
    a processing tool to process a workpiece; and
    a process controller operatively coupled to said processing tool, said process controller to perform an interconnect characteristic control process based upon manufacturing data relating to said workpiece, said interconnect characteristic control process comprising controlling at least one of a barrier layer process, a pre-dielectric process, an ILD process, and a metal deposition process relating to a structure associated with an interconnect location on said workpiece to control a characteristic relating to said interconnect location.

14. The system of claim 13, wherein said workpiece is a semiconductor wafer.

15. The system of claim 13, wherein said interconnect location comprises at least one of a contact and a via.

16. The system of claim 15, wherein said process controller is capable of control a resistivity of said interconnect location.

17. The system of claim 13, wherein said process controller is capable of control at least one of barrier layer process, an inner-layer dielectric (ILD) layer process, pre-metal dielectric (PMD) process, and a metal deposition process.

18. The system of claim 13, further comprising:
    a metrology tool operatively coupled to said process controller and to said processing tool, said metrology tool to acquire metrology data relating to said processed workpiece;
    a wafer electrical test unit operatively coupled to said process controller, said wafer electrical test unit to acquire electrical test data relating to said interconnect location; and
    an interconnect control unit operatively coupled to said process controller, said interconnect control unit to calculate adjustments to a process performed by said processing tool in response to at least one of said metrology tool and said electrical test data.

19. The system of claim 18, further comprising at least one sub-controller operatively coupled to said process controller, said sub-controller to implement control of a process performed by said processing tool in response to a predetermined interconnect characteristic provided by said process controller.

20. The system of claim 18, further comprising a database unit to store said at least one of metrology data and said electrical test data.

21. An apparatus, comprising:
    a process controller operatively adapted to control at least one of a barrier layer process, a pre-dielectric process, and ILD process, an a metal deposition process relating to a structure associated with an interconnect location on a workpiece for controlling a characteristic relating to said interconnect location.

22. The apparatus of claim 21, wherein said workpiece is a semiconductor wafer.

23. The apparatus of claim 21, wherein said interconnect location comprises at least one of a contact and a via.

24. The apparatus of claim 23, wherein said process controller is capable of control a resistivity of said interconnect location.

25. The apparatus of claim 21, wherein said process controller is capable of control at least one of a barrier layer process, an inner-layer dielectric (ILD) layer process, pre-metal dielectric (PMD) process, and a metal deposition process.

26. The apparatus of claim 21, further comprising:
   a metrology tool operatively coupled to said process controller and to said processing tool, said metrology tool to acquire metrology data relating to said processed workpiece;
   a wafer electrical test unit operatively coupled to said process controller, said wafer electrical test unit to acquire electrical test data relating to said interconnect location; and
   an interconnect control unit operatively coupled to said process controller, said interconnect control unit to calculate adjustments to a process performed by said processing tool in response to at least one of said metrology tool and said electrical test data.

27. The apparatus of claim 24, further comprising at least one sub-controller operatively coupled to said process controller, said sub-controller to implement control of a process performed by said processing tool in response to a predetermined interconnect characteristic provided by said process controller.

28. A computer readable program storage device encoded with instructions that, when executed by a computer, performs a method, comprising:
   performing a process step upon a workpiece;
   acquiring manufacturing data relating to an interconnect location on said workpiece; and
   performing an interconnect characteristic control process based upon said manufacturing data, said interconnect characteristic control process comprising controlling at least one of a barrier layer process, a pre-dielectric process, an ILD process, and a metal deposition process relating to a structure associated with said interconnect location on said workpiece to control a characteristic relating to said interconnect location.

29. The computer readable program storage device encoded with instructions that, when executed by a computer, performs the method of claim 28, wherein performing said process step upon said workpiece further comprises performing said process step upon a semiconductor wafer.

30. The computer readable program storage device encoded with instructions that, when executed by a computer, performs the method of claim 29, wherein performing said process step upon a workpiece comprises forming an interconnect location upon said semiconductor wafer.

31. The computer readable program storage device encoded with instructions that, when executed by a computer, performs the method of claim 30, wherein forming an interconnect location upon said semiconductor wafer comprises forming a via upon said semiconductor wafer.

32. The computer readable program storage device encoded with instructions that, when executed by a computer, performs the method of claim 30, wherein forming said interconnect location upon said semiconductor wafer comprises forming a contact region upon said semiconductor wafer.

33. The computer readable program storage device encoded with instructions that, when executed by a computer, performs the method of claim 29, wherein acquiring manufacturing data relating to said interconnect location on said workpiece further comprises acquiring metrology relating to said processed semiconductor wafer.

34. The computer readable program storage device encoded with instructions that, when executed by a computer, performs the method of claim 28, wherein acquiring manufacturing data relating to said interconnect location on said workpiece further comprises acquiring wafer electrical test data relating to said processed semiconductor water.

35. The computer readable program storage device encoded with instructions that, when executed by a computer, performs the method of claim 28, wherein performing said interconnect characteristic control process further comprises controlling at least one of a barrier layer process, an inner-layer dielectric (ILD) layer process, pre-metal dielectric (PMD) process, and a metal deposition process.

36. The computer readable program storage device encoded with instructions that, when executed by a computer, performs the method of claim 28, wherein performing said interconnect characteristic control process further comprises performing modifying a resistivity of said interconnect location.

* * * * *

UNITED STATES PATENT AND TRADEMARK OFFICE
CERTIFICATE OF CORRECTION

PATENT NO. : 6,842,661 B2
DATED : January 11, 2005
INVENTOR(S) : Robert J. Chong and Eric O. Green It is certified that error appears in the above-identified patent and that said Letters Patent is hereby corrected as shown below:

Column 14,
Line 31, delete "water" and insert -- wafer --.

Signed and Sealed this

Third Day of May, 2005

JON W. DUDAS
*Director of the United States Patent and Trademark Office*